(12) United States Patent
Chen et al.

(10) Patent No.: US 11,594,660 B2
(45) Date of Patent: Feb. 28, 2023

(54) SEMICONDUCTOR DEVICE PACKAGE

(71) Applicant: Advanced Semiconductor Engineering, Inc., Kaohsiung (TW)

(72) Inventors: Tang-Yuan Chen, Kaohsiung (TW); Meng-Wei Hsieh, Kaohsiung (TW); Cheng-Yuan Kung, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 141 days.

(21) Appl. No.: 16/809,500

(22) Filed: Mar. 4, 2020

(65) Prior Publication Data

US 2021/0280744 A1    Sep. 9, 2021

(51) Int. Cl.
*H01L 33/14* (2010.01)
*H01L 33/00* (2010.01)
*H01L 33/26* (2010.01)

(52) U.S. Cl.
CPC .......... *H01L 33/14* (2013.01); *H01L 33/0095* (2013.01); *H01L 33/26* (2013.01)

(58) Field of Classification Search
CPC ..... H01L 33/14; H01L 33/0095; H01L 33/26; H01L 21/4846; H01L 23/49811; H01Q 1/2283
See application file for complete search history.

(56) References Cited

U.S. PATENT DOCUMENTS

| | | | |
|---|---|---|---|
| 10,366,966 B1 * | 7/2019 | Wan | H01L 25/50 |
| 2017/0345731 A1 * | 11/2017 | Chiang | H01L 24/19 |
| 2019/0067219 A1 * | 2/2019 | Lasiter | H01L 21/568 |
| 2019/0157208 A1 * | 5/2019 | Lin | H01L 24/20 |
| 2019/0295972 A1 * | 9/2019 | Tsai | H01L 21/486 |
| 2020/0203817 A1 * | 6/2020 | Chiang | H01Q 1/2283 |

* cited by examiner

*Primary Examiner* — Mohammed R Alam
(74) *Attorney, Agent, or Firm* — Foley & Lardner LLP

(57) ABSTRACT

A semiconductor device package includes a carrier, an emitting element and a first package body. The carrier includes a first surface and a second surface opposite to the first surface. The emitting element is disposed on the first surface of the carrier. The first package body is disposed over the first surface of the carrier and spaced apart from the first surface of the carrier.

13 Claims, 21 Drawing Sheets

SEMICONDUCTOR DEVICE PACKAGE

BACKGROUND

1. Technical Field

The present disclosure relates to a semiconductor device package and a method of manufacturing the same, and more particularly to a semiconductor device package including an emitting component and a method of manufacturing the same.

2. Description of the Related Art

Wireless communication devices, such as cell phones, typically include antennas for transmitting and receiving radio frequency (RF) signals. Comparably, a wireless communication device includes an antenna and a communication module, each disposed on different parts of a circuit board. Under the comparable approach, the antenna and the communication module are separately manufactured and electrically connected together after being placed on the circuit board. Accordingly, separate manufacturing costs may be incurred for both components. Furthermore, it may be difficult to reduce a size of the wireless communication device to attain a suitably compact product design. To reduce the cost and package size, an Antenna-in-Package (AiP) approach is provided. In general, an organic substrate is commonly used in an AiP system. However, due to the process limitation of the organic substrate, it is difficult to achieve fine-pitch (less than 15/15 μm), and the thickness of the organic substrate is relatively thick, which will hinder the miniaturization of the AiP system.

SUMMARY

In accordance with some embodiments of the present disclosure, a semiconductor device package includes a carrier, an emitting element and a first package body. The carrier includes a first surface and a second surface opposite to the first surface. The emitting element is disposed on the first surface of the carrier. The first package body is disposed over the first surface of the carrier and spaced apart from the first surface of the carrier.

In accordance with some embodiments of the present disclosure, a semiconductor device package includes a carrier, an emitting element, a first building-up layer and an electrical element. The carrier has a first surface and a second surface opposite to the first surface. The emitting element is disposed on the first surface of the carrier. The first building-up layer is disposed on the second surface of the carrier. The first building-up layer has a first conductive layer, a dielectric layer covering the conductive layer and a second conductive layer on the dielectric layer and electrically connected to the first conductive layer. The electrical element is disposed on the second conductive layer.

In accordance with some embodiments of the present disclosure, a method of manufacturing a semiconductor device package includes (a) providing a circuit layer including a first carrier, a first building-up layer on the first carrier and a second carrier on the first building-up layer; and (b) thinning the first carrier and the second carrier.

Figure 1A:
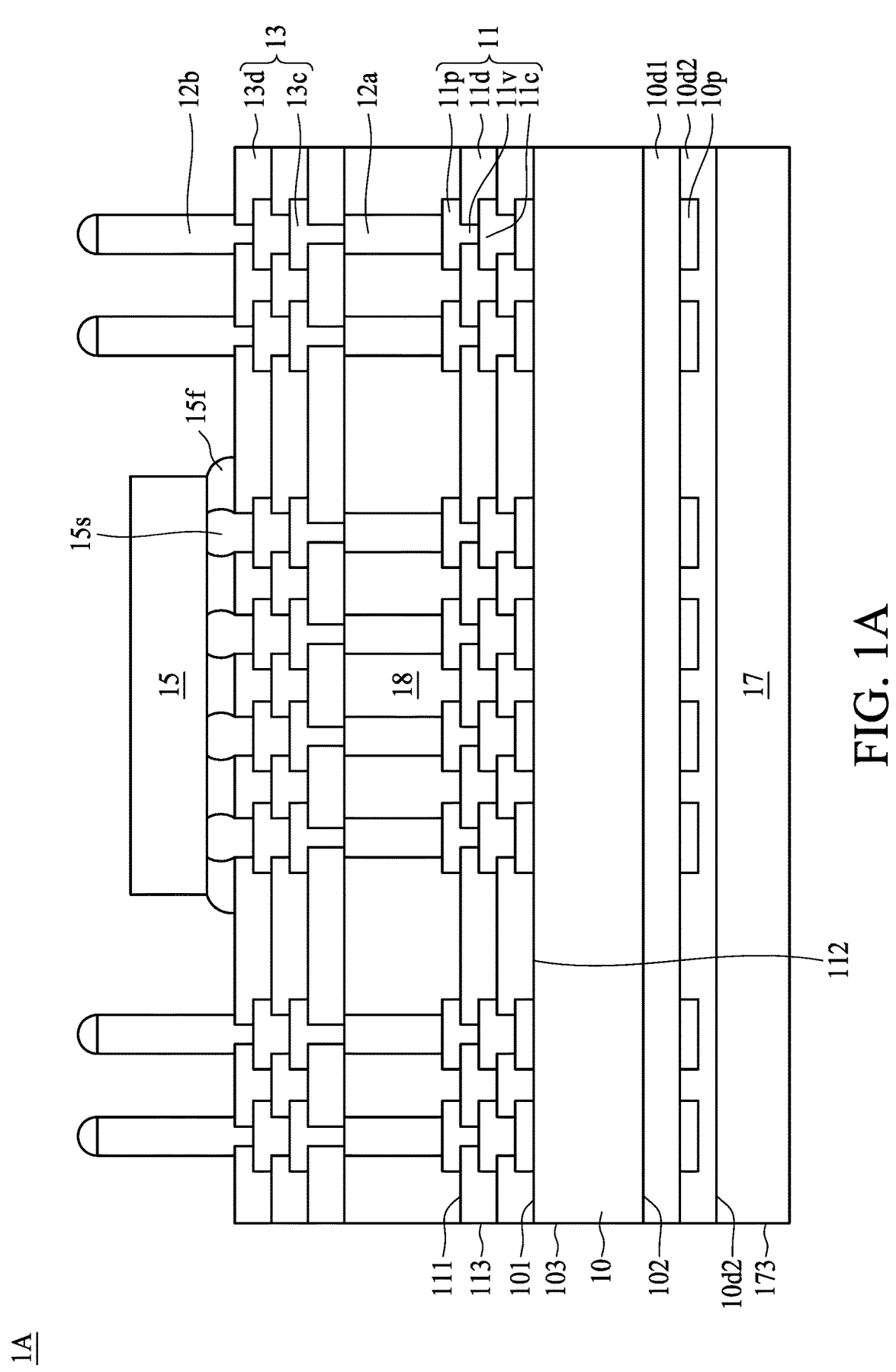
FIG. 1A illustrates a cross-sectional view of a semiconductor device package in accordance with some embodiments of the present disclosure.

Common reference numerals are used throughout the drawings and the detailed description to indicate the same or similar components. The present disclosure will be readily understood from the following detailed description taken in conjunction with the accompanying drawings.

DETAILED DESCRIPTION

FIG. 1A illustrates a cross-sectional view of a semiconductor device package 1A in accordance with some embodiments of the present disclosure. The semiconductor device package 1A includes a carrier 10, circuit layers 11, 13, conductive structures 12a, 12b, an electronic component 15 and package bodies 17, 18.

In some embodiments, the carrier 10 (also can be referred to as a stand-off layer) may be or include a glass substrate. The carrier 10 may include conductive pad(s), trace(s), and interconnection(s) (e.g. via(s)). In some embodiments, the carrier 10 may include transparent material. In some embodiments, the carrier 10 may include opaque material. Compared to the organic substrate, it is easier to control the thickness of a glass carrier, which can facilitate the miniaturization of the semiconductor device package 1A. The carrier 10 includes a material having a dielectric constant (Dk) less than approximately 5. The carrier 10 includes a material having a Dk less than approximately 3. The carrier 10 includes a material having a loss tangent or dissipation factor (Df) less than approximately 0.005. The carrier 10 includes a material having a loss tangent or Df less than approximately 0.003. In some embodiments, the thickness of the carrier 10 is about 400 In some embodiments, a coefficient of thermal expansion (CTE) of the carrier 10 is in a range from about 0.5 to about 13. In some embodiments, the CTE of the carrier 10 is in a range from about 3.6 to about 8.5.

The carrier 10 has a surface 101, a surface 102 opposite to the surface 101 and a lateral surface 103 extending between the surface 101 and the surface 102. A dielectric layer 10d1 is disposed on the surface 102 of the carrier 10. A conductive layer 10p is disposed on a surface of the dielectric layer 10d1 facing away from the carrier 10. In some embodiments, the conductive layer 10p defines a patterned antenna, such as a directional antenna, an omni-directional antenna, an antenna array. For example, the conductive layer 10p defines a patch antenna. In some embodiments, the conductive layer 10p may be or include one or more light emitting devices or sensors. A dielectric layer 10d2 is disposed on the surface of the dielectric layer 10d1 facing away from the carrier 10 and covers the conductive layer 10p. In some embodiments, a lateral surface of the dielectric layer 10d1 is substantially coplanar with a lateral surface of the dielectric layer 10d2.

In some embodiments, the dielectric layers 10d1, 10d2 may include pre-impregnated composite fibers (e.g., pre-preg), Borophosphosilicate Glass (BPSG), silicon oxide, silicon nitride, silicon oxynitride, Undoped Silicate Glass (USG), any combination of two or more thereof, or the like. Examples of a pre-preg may include, but are not limited to, a multi-layer structure formed by stacking or laminating a number of pre-impregnated materials/sheets. In some embodiments, the conductive layer 10p is, or includes, a conductive material such as a metal or metal alloy. Examples of the conductive material include gold (Au), silver (Ag), copper (Cu), platinum (Pt), Palladium (Pd), other metal(s) or alloy(s), or a combination of two or more thereof.

The package body 17 is disposed on a surface of the dielectric layer 10d2 facing away from the carrier 10. The package body 17 is spaced apart from the surface 102 of the carrier 10 by the dielectric layers 10d1, 10d2. The package body 17 is spaced apart from the conductive layer 10p by the dielectric layer 10d2. In some embodiments, the package body 17 has a lateral surface 173 substantially coplanar with the lateral surfaces of the dielectric layers 10d1, 10d2 and the lateral surface 103 of the carrier 10. In some embodiments, the package body 17 includes an epoxy resin including fillers, a molding compound (e.g., an epoxy molding compound or other molding compound), a polyimide, a phenolic compound or material, a material including a silicone dispersed therein, or a combination thereof.

The circuit layer 11 (or building-up circuit) is disposed on the surface 101 of the carrier 10. The circuit layer 11 has a surface 111 facing away from the carrier 10, a surface 112 opposite to the surface 111 and a lateral surface 113 extending between the surface 111 and the surface 112. The surface 112 of the circuit layer 11 is in contact with the surface 101 of the carrier. In some embodiments the lateral surface 113 of the circuit layer 11 is substantially coplanar with the lateral surface 103 of the carrier 10.

The circuit layer 11 includes one or more conductive layers (e.g., redistribution layers, RDLs) 11c and one or more dielectric layers 11d. A portion of the conductive layer 11c is covered or encapsulated by the dielectric layer 11d while another portion of the conductive layer 11c is exposed from the dielectric layer 11d to provide electrical connections. In some embodiments, a surface of the conductive layer 11c facing the carrier 10 and exposed from the dielectric layer 11d is in contact with the surface 101 of the carrier 10. In some embodiments, the conductive layer 11c may be or include one or more antenna patterns, light emitting devices, sensors or the like.

In some embodiments, the circuit layer 11 may include a conductive pad 11p (e.g., pillar land) disposed on the surface 111 of the circuit layer 11. A bottom surface of the conductive pad 11p is in contact with the dielectric layer 11d. A top surface and a lateral surface of the conductive pad 11p are exposed from the dielectric layer 11d. The conductive pad 11p is electrically connected to the conductive layer 11c through a conductive via 11v. For example, the conductive pad 11p may include a portion (e.g., the conductive via 11v) extending into the dielectric layer 11d and electrically connected to the conductive layer 11c. In some embodiments, the conductive via 11v is in contact with the conductive layer 11c. In other embodiments, a seed layer may be disposed between the conductive via 11v and the conductive layer 11c. In some embodiments, a width (or an area) of the conductive pad 11p is greater than a width (a diameter or an area) of the conductive structure 12a (e.g., a conductive pillar). In some embodiments, a width (or an area) of the conductive via 11v is less than the width (the diameter or the area) of the conductive structure 12a.

In some embodiments, the dielectric layer 11d may include pre-impregnated composite fibers (e.g., pre-preg), BPSG, silicon oxide, silicon nitride, silicon oxynitride, USG, any combination of two or more thereof, or the like. Examples of a pre-preg may include, but are not limited to, a multi-layer structure formed by stacking or laminating a number of pre-impregnated materials/sheets. In some embodiments, there may be any number of conductive layers 11c depending on design specifications. In some embodiments, the conductive layer 11c, the conductive pad 11p and the conductive via are formed of or includes Au, Ag, Cu, Pt, Pd, or an alloy thereof.

One or more conductive structures 12a (e.g., conductive pillars or conductive elements) are disposed on the surface 111 of the circuit layer 11. The conductive structures 12a are electrically connected to the circuit layer 11 through the conductive pad 11p. In some embodiments, the conductive structure 12a is in contact with the conductive pad 11p. In some embodiments, the conductive structure 12a may be connected to the conductive pad 11p through an adhesive layer or a seed layer. For example, the adhesive layer or the seed layer is in contact with both the conductive structure 12a and the conductive pad 11p. In some embodiments, the conductive structures 12a may define an antenna structure. The conductive structure 12a is, or includes, a conductive material such as a metal or metal alloy. Examples of the conductive material include Au, Ag, Cu, Pt, Pd, or an alloy thereof.

The package body 18 is disposed on the surface 111 of the circuit layer 11. The package body 18 covers the conductive structures 12a and the conductive pad 11p. In some embodiments, the package body 18 has a lateral surface substantially coplanar with the lateral surface 113 of the circuit layer 11. In some embodiments, the package body 18 includes an epoxy resin including fillers, a molding compound (e.g., an epoxy molding compound or other molding compound), a polyimide, a phenolic compound or material, a material including a silicone dispersed therein, or a combination thereof.

The circuit layer 13 (or building-up circuit) is disposed on the package body 18. The circuit layer 13 has one or more dielectric layers 13d and one or more conductive layers 13c. In some embodiments, the dielectric layer 13d may include the same material as the dielectric layer 11d. Alternatively, the dielectric layer 13d and the dielectric layer 11d may include different materials. The conductive layer 13c is electrically connected to the conductive structures 12a. In some embodiments, there may be any number of conductive layers 13c depending on design specifications.

One or more conductive structures 12b (e.g., conductive pillars or conductive elements) are disposed on a surface of the circuit layer 13 facing away from the circuit layer 11. The conductive structures 12b are electrically connected to the circuit layer 13. The conductive structure 12b is, or includes, a conductive material such as a metal or metal alloy. Examples of the conductive material include Au, Ag, Cu, Pt, Pd, or an alloy thereof. In some embodiments, the conductive structures 12b may be replaced by solder balls (e.g., controlled collapse chip connection (C4) bump, a ball grid array (BGA) or a land grid array (LGA)).

The electronic component 15 is disposed on the surface of the circuit layer 13 facing away from the circuit layer 11. The electronic component 15 may be an active electronic component, such as an integrated circuit (IC) chip or a die. The active surface of the electronic component 15 faces the circuit layer 13. The electronic component 15 is electrically connected to the circuit layer 13 (e.g., to the conductive layer 13c) through electrical contacts 15s (e.g., solder balls), and the electrical connection can be achieved by, for example, flip-chip technique. In some embodiments, an underfill 15f is disposed between the electronic component 15 and the circuit layer 13 to cover the electrical contacts 15s. In other embodiments, the underfill 15f may be omitted.

Figure 1B:
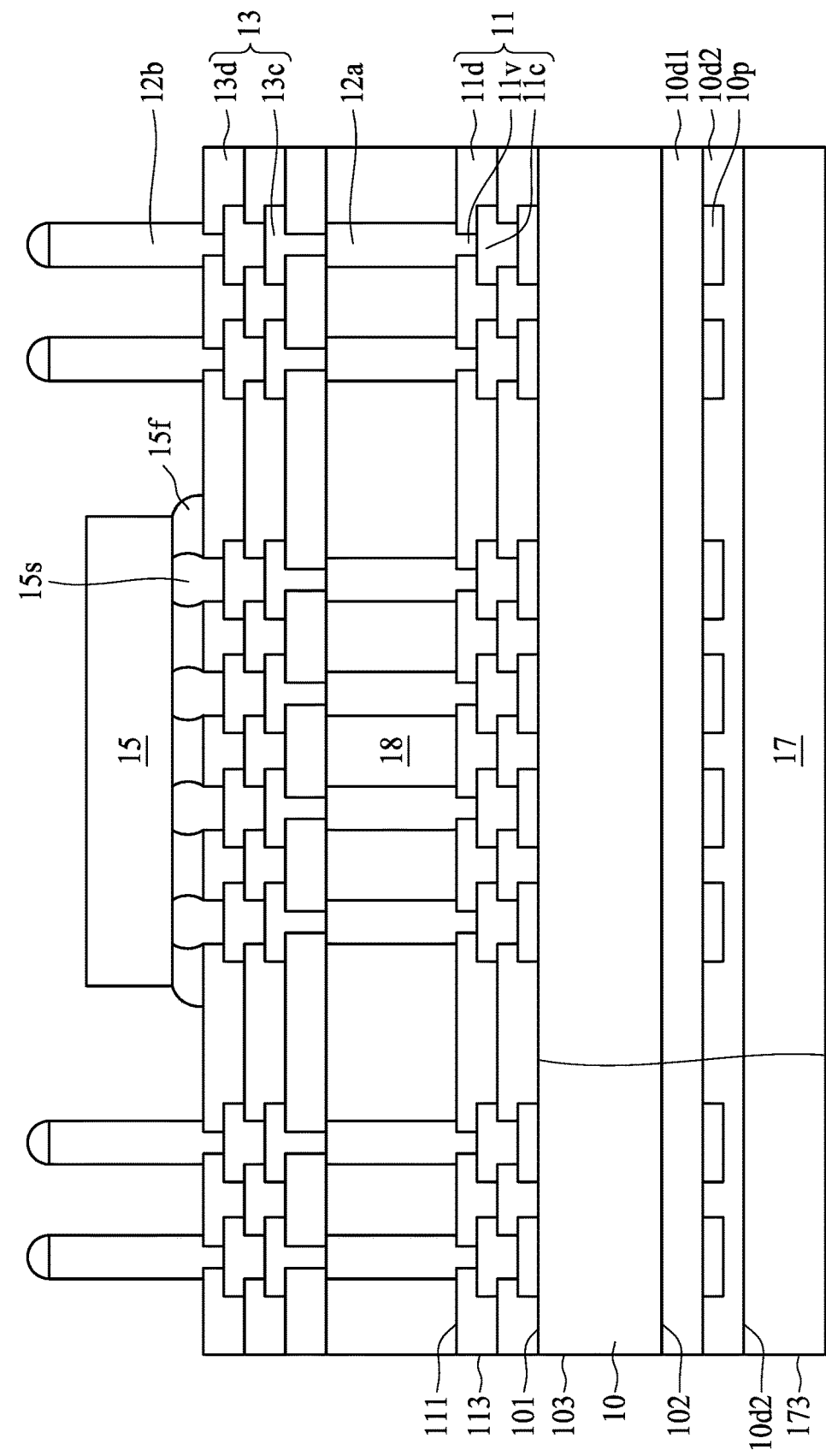
FIG. 1B illustrates a cross-sectional view of a semiconductor device package in accordance with some embodiments of the present disclosure.

FIG. 1B illustrates a cross-sectional view of a semiconductor device package 1B in accordance with some embodiments of the present disclosure. The semiconductor device package 1B is similar to the semiconductor device package 1A as shown in FIG. 1A, except that in FIG. 1B, conductive pad 11p as shown in FIG. 1A is omitted. The conductive structure 12a has a portion (e.g., the conductive via 11v) further extending within the dielectric layer 11d and electrically connected to the conductive layer 11c.

Figure 2:
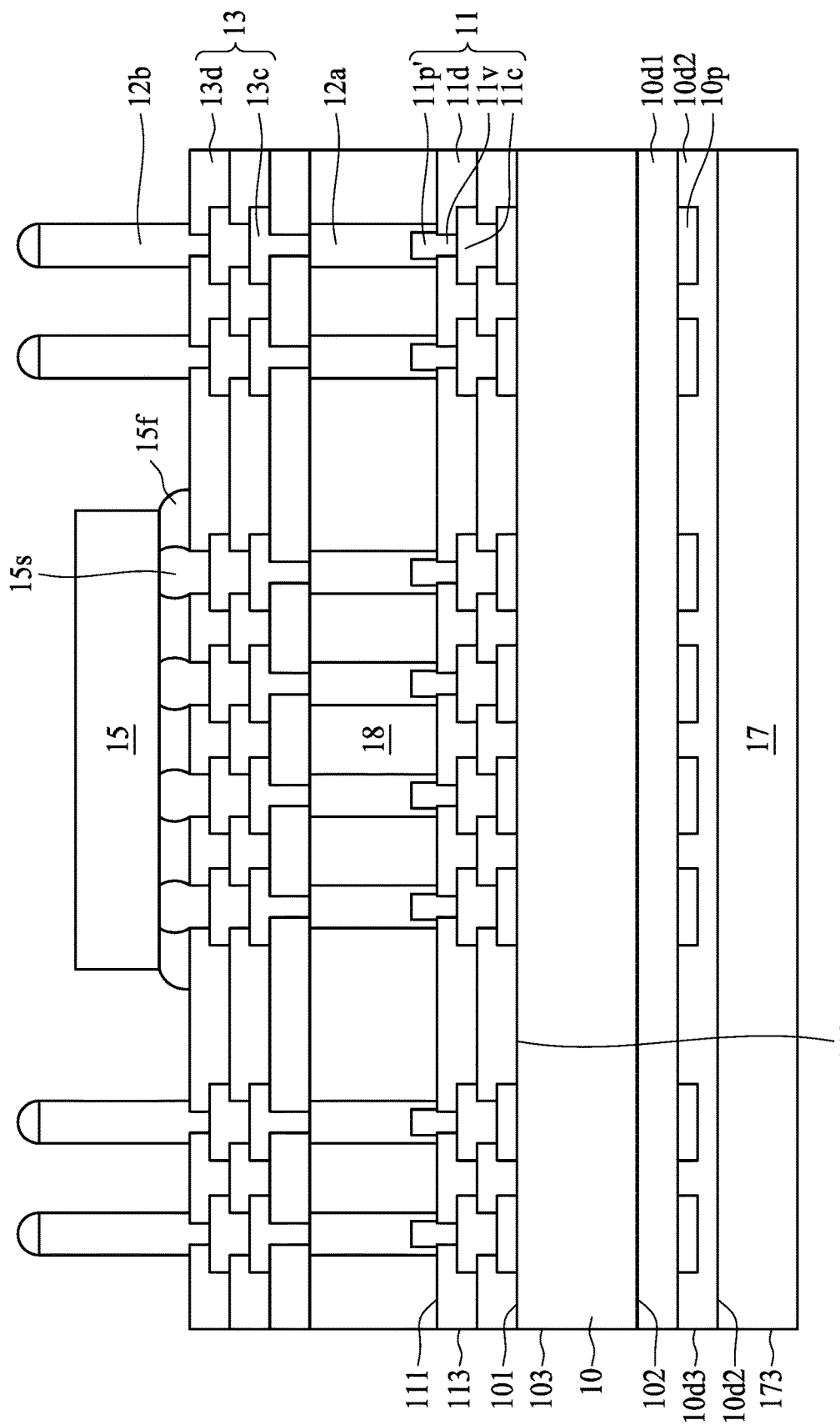
FIG. 2 illustrates a cross-sectional view of a semiconductor device package in accordance with some embodiments of the present disclosure.

FIG. 2 illustrates a cross-sectional view of a semiconductor device package 2 in accordance with some embodiments of the present disclosure. The semiconductor device package 2 is similar to the semiconductor device package 1A as shown in FIG. 1A, and the differences therebetween are described below.

Referring to FIG. 2, a width (or an area) of a conductive pad 11p' is less than the width (or the area) of the conductive structure 12a. For example, a top surface and a lateral surface of the conductive pad 11p' are covered by the conductive structure 12a. In some embodiments, the top surface and the lateral surface of the conductive pad 11p' are in contact with the conductive structure 12a. In some embodiments, the width (or the area) of a conductive pad 11p' may be equal to the width (or the area) of the conductive via 11v. Alternatively, the width (or the area) of a conductive pad 11p' may be greater than or less than the width (or the area) of the conductive via 11v.

Figure 3:
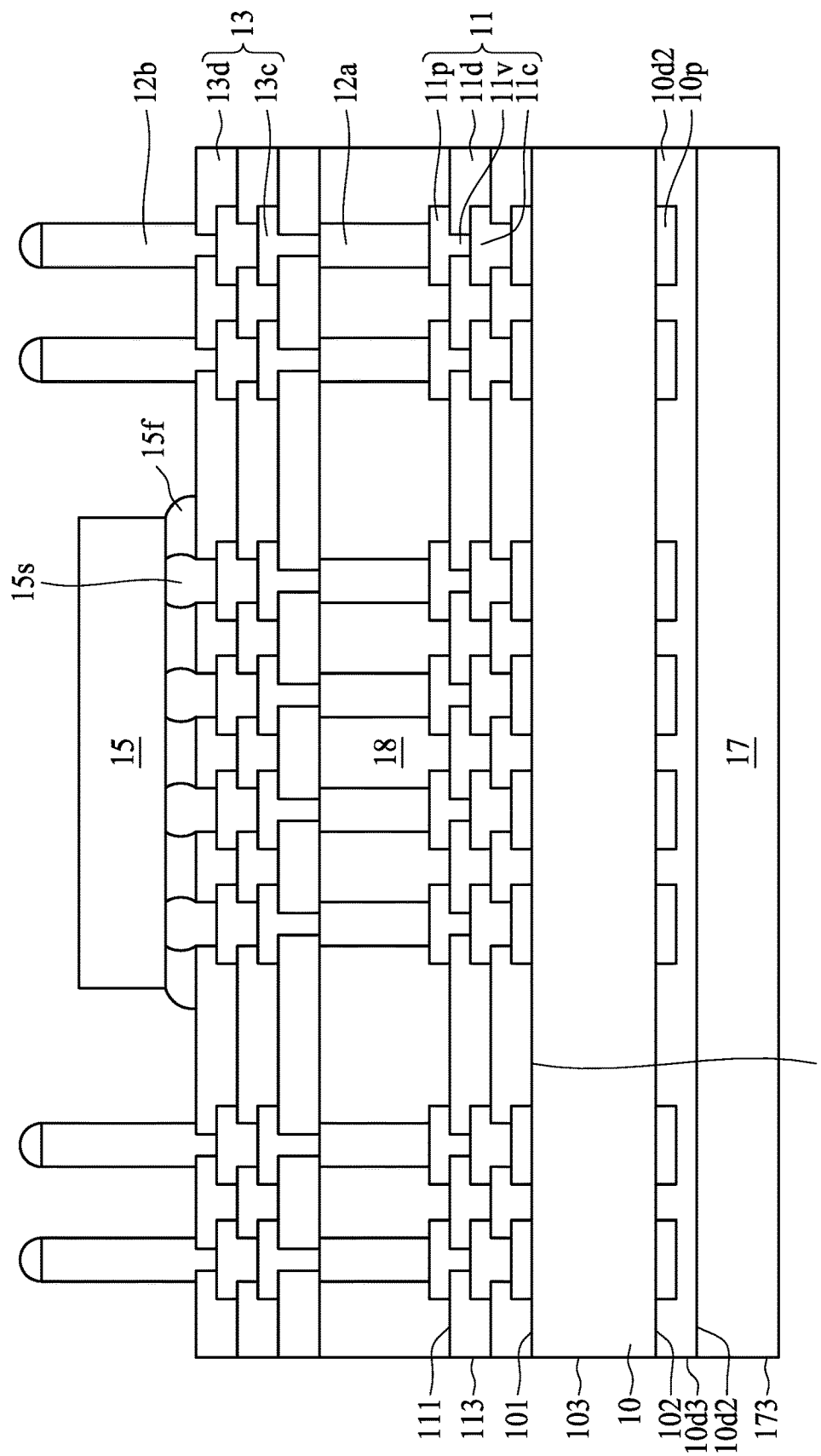
FIG. 3 illustrates a cross-sectional view of a semiconductor device package in accordance with some embodiments of the present disclosure.

FIG. 3 illustrates a cross-sectional view of a semiconductor device package 3 in accordance with some embodiments of the present disclosure. The semiconductor device package 3 is similar to the semiconductor device package 1A as shown in FIG. 1A except that in FIG. 3, the dielectric layer 10d1 as shown in FIG. 1A is omitted. The conductive layer 10p is in contact with the surface 102 of the carrier 10.

Figure 4:
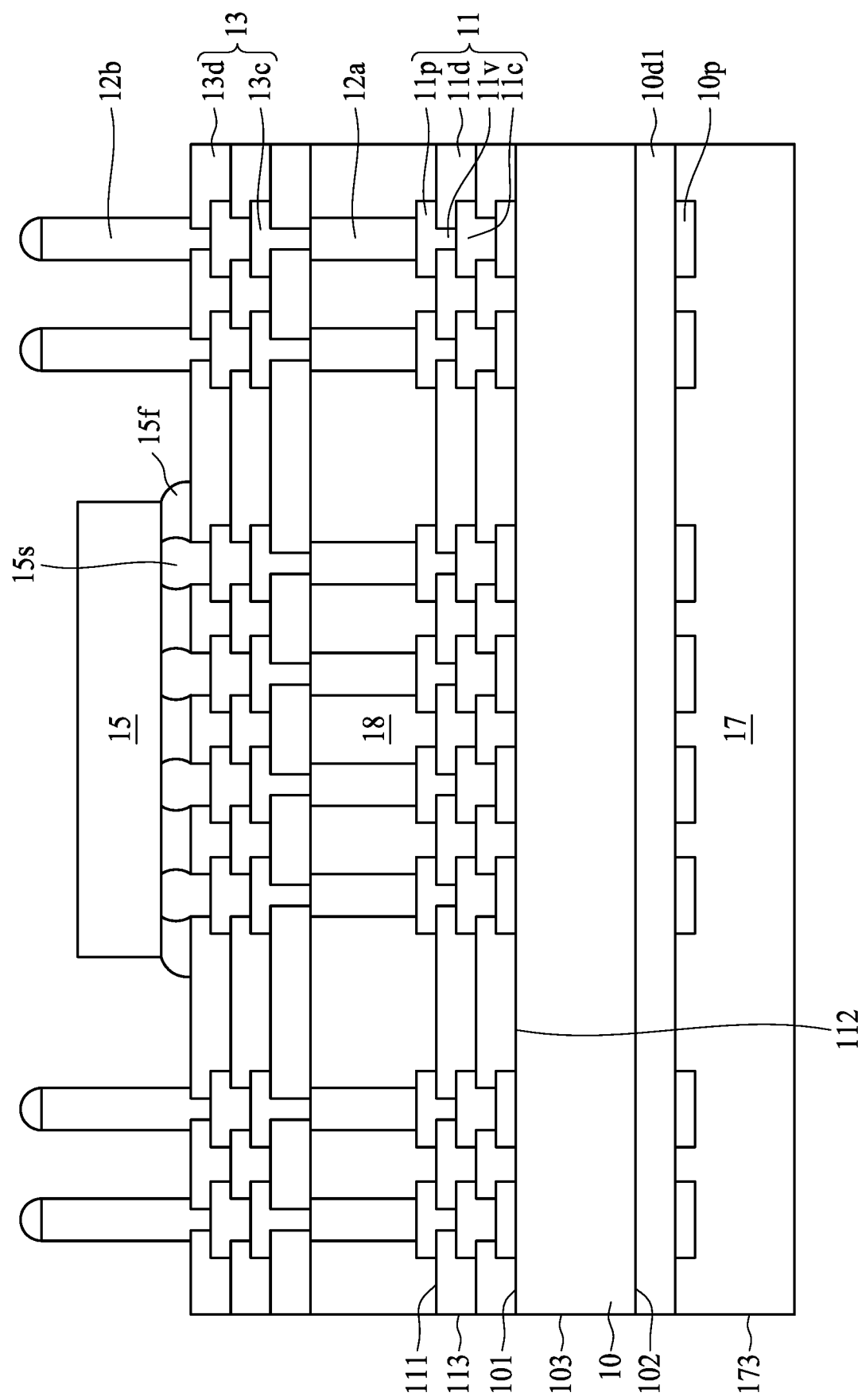
FIG. 4 illustrates a cross-sectional view of a semiconductor device package in accordance with some embodiments of the present disclosure.

FIG. 4 illustrates a cross-sectional view of a semiconductor device package 4 in accordance with some embodiments of the present disclosure. The semiconductor device package 4 is similar to the semiconductor device package 1A as shown in FIG. 1A except that in FIG. 4, the dielectric layer 10d2 as shown in FIG. 1A is omitted. The package body 17 is in contact with the dielectric layer 10d1 and the conductive layer 10p.

FIG. 5A, FIG. 5B, FIG. 5C, FIG. 5D, FIG. 5E, FIG. 5F, FIG. 5G and FIG. 5H illustrate a semiconductor manufacturing method in accordance with some embodiments of the present disclosure. In some embodiments, the method in FIG. 5A, FIG. 5B, FIG. 5C, FIG. 5D, FIG. 5E, FIG. 5F, FIG. 5G and FIG. 5H can be used to manufacture the semiconductor device package 1B in FIG. 1B.

Figure 5A:
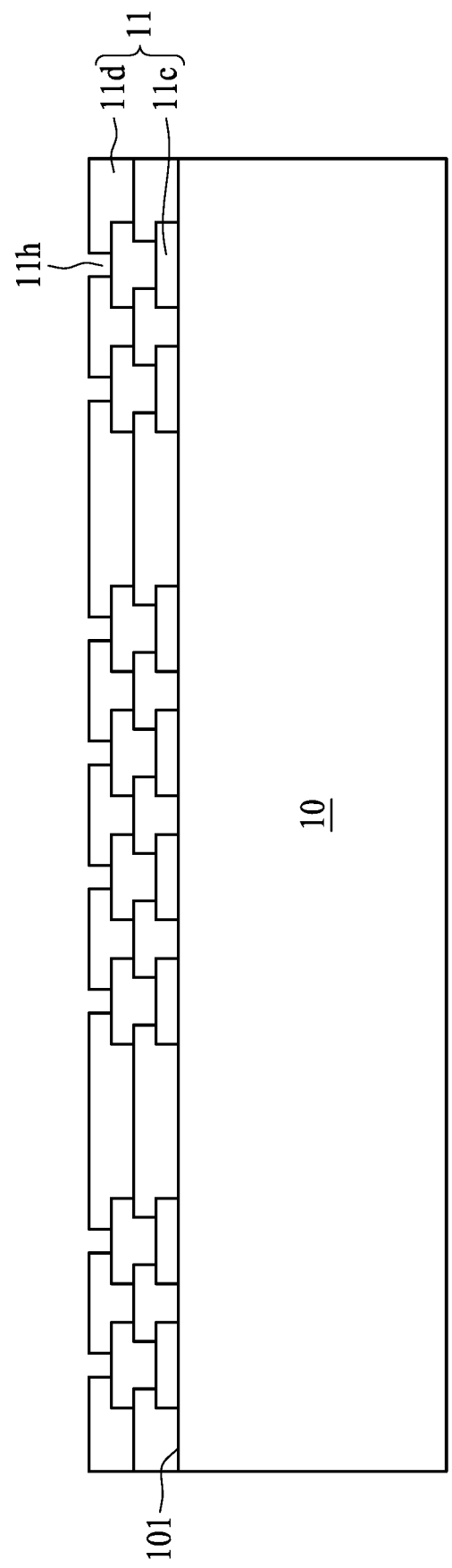
FIG. 5A, FIG. 5B, FIG. 5C, FIG. 5D, FIG. 5E, FIG. 5F, FIG. 5G and FIG. 5H illustrate a semiconductor manufacturing method in accordance with some embodiments of the present disclosure.

Referring to FIG. 5A, a carrier 10 is provided. The carrier 10 may be in a wafer type, a panel type or a strip type. In some embodiments, the carrier 10 may be a glass wafer. A circuit layer 11 including one or more conductive layers 11c and one or more dielectric layers 11d is formed on a surface 101 of the carrier 10. The dielectric layer 11d may be formed by, for example but is not limited to, photolithographic technique. One or more holes 11h are formed to penetrate a portion of the dielectric layer 11d and to expose a portion of the conductive layer 11c.

Figure 5B:
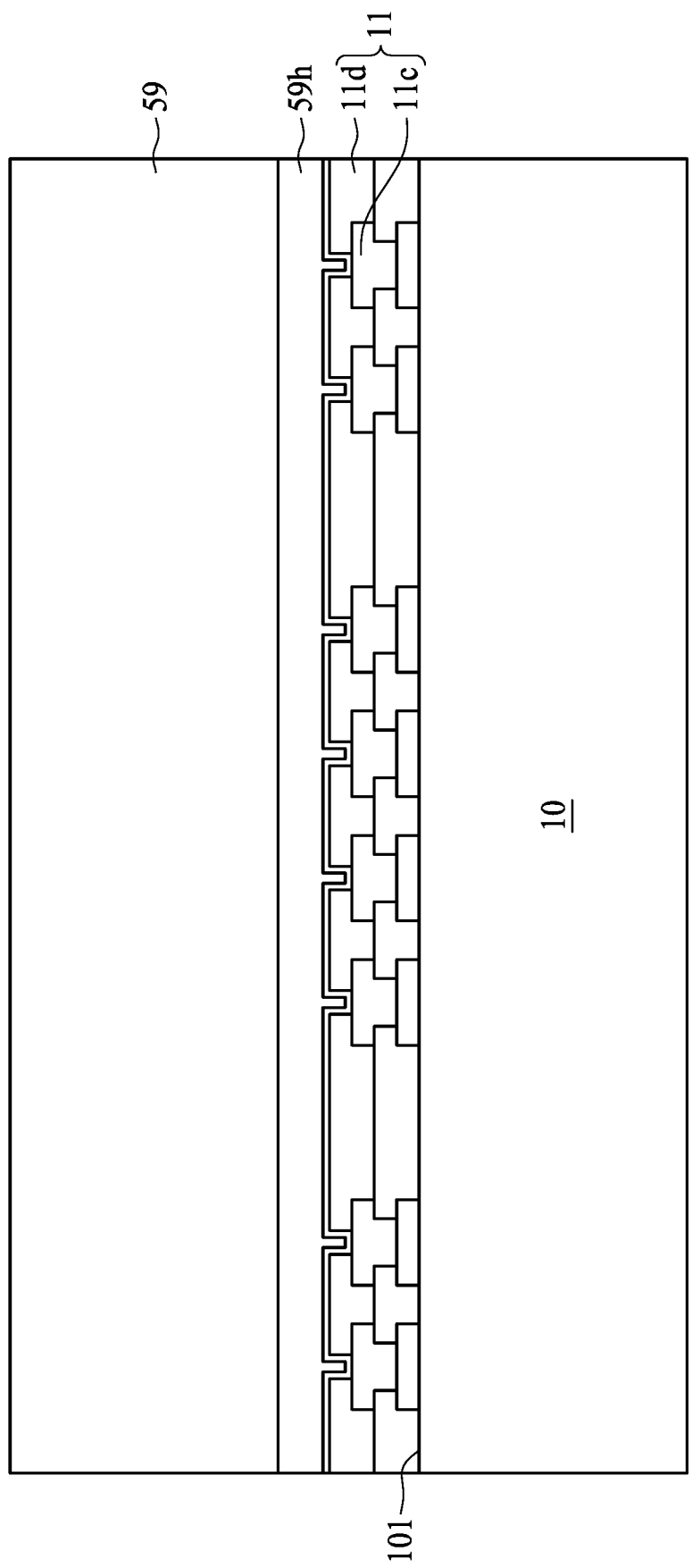

Referring to FIG. 5B, a carrier 59 having an adhesive layer 59h (e.g., a tape or glue) is disposed on the circuit layer 11. The adhesive layer 59h is disposed on the dielectric layer 11d and may extend within the holes 11h. In some embodiments, a seed layer may be disposed between the adhesive layer 59h and the dielectric layer 11d.

Figure 5C:
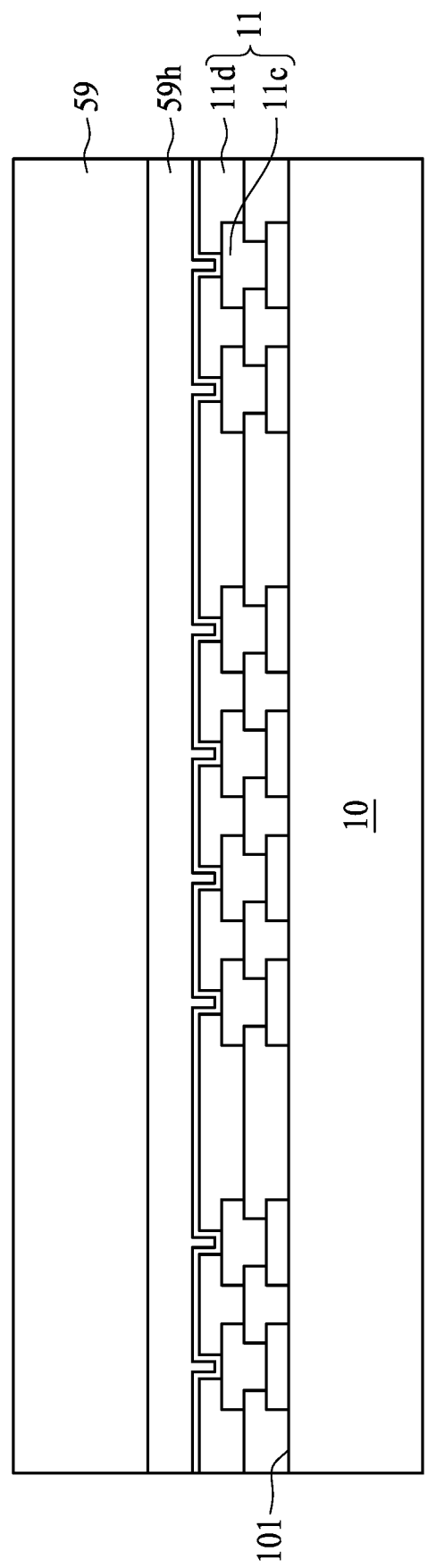

Referring to FIG. 5C, a portion of the carrier 10 and a portion of the carrier 59 are removed to reduce the thickness of each of the carrier 10 and the carrier 59. In some embodiments, the carrier 10 and the carrier 59 may be thinned by, for example, grinding or any other suitable processes. In some embodiments, each of the carrier 10 and the carrier 59 may have a thickness more than 400 micrometers before the thinning operation as shown in FIG. 5C. For example, each of the carrier 10 and the carrier 59 may have the thickness about 700 micrometers. In some embodiments, after the thinning operation as shown in FIG. 5C, the thickness of each of the carrier 10 and the carrier 59 is about 400 micrometers. Each of the carrier 10 and the carrier 59 may have any thicknesses depending on different design specifications.

Figure 5D:
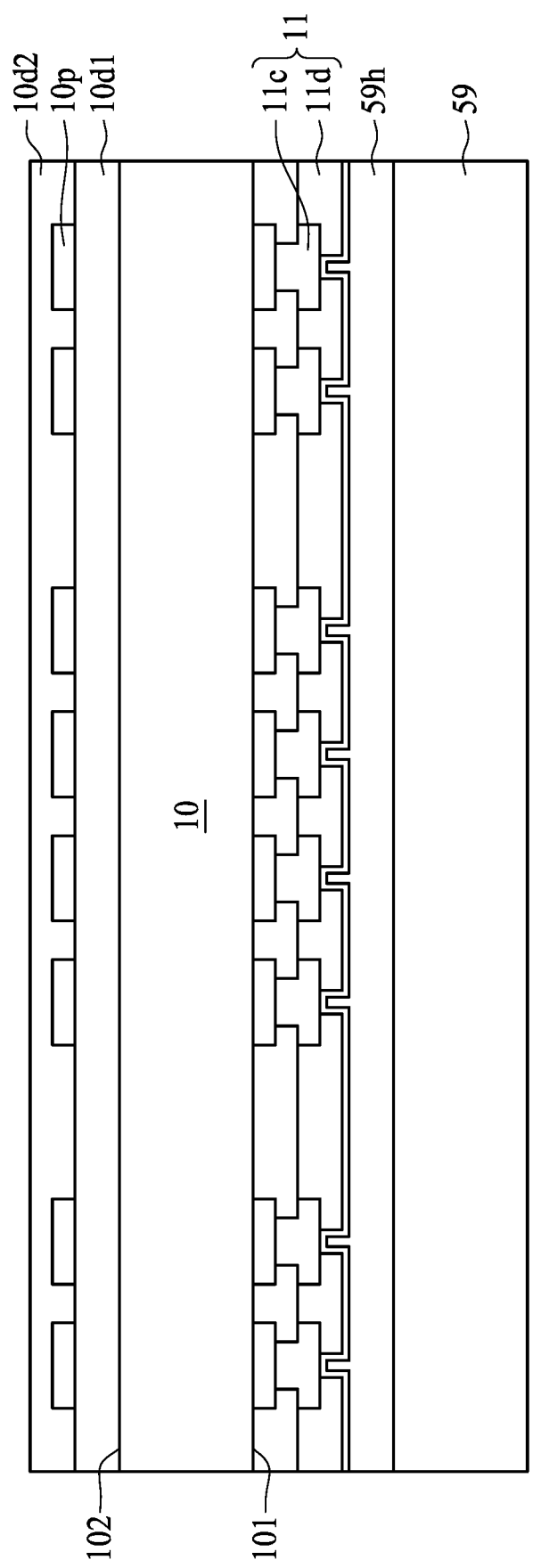

Referring to FIG. 5D, a dielectric layer 10d1 is formed on a surface 102 of the carrier 10. Conductive layers 10p are formed on the dielectric layer 10d1. In some embodiments, the conductive layers 10p may be antenna patterns, light emitting devices or sensors. A dielectric layer 10d2 is then formed on the dielectric layer 10d1 to cover the conductive layers 10p. In some embodiments, the dielectric layer 10d1 may be omitted, and the conductive layers 10p are directly formed on the surface 102 of the carrier 10.

Figure 5E:
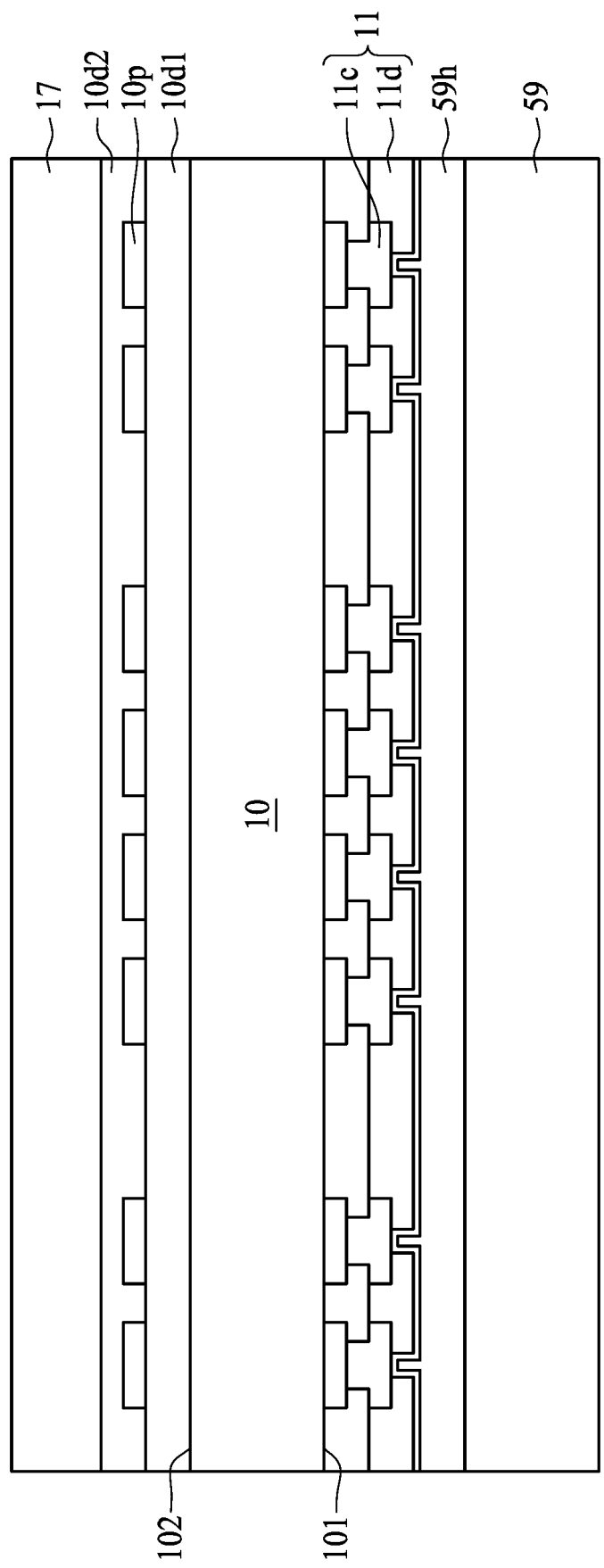

Referring to FIG. 5E, a package body 17 is formed on the dielectric layer 10d2. In some embodiments, the package body 17 is formed by, for example, by a transfer molding technique, a compression technique or any other suitable techniques. In some embodiments, the dielectric layer 10d2 may be omitted, and the package body 17 is directly formed on the dielectric layer 10d1 and covers the conductive layers 10p.

Figure 5F:
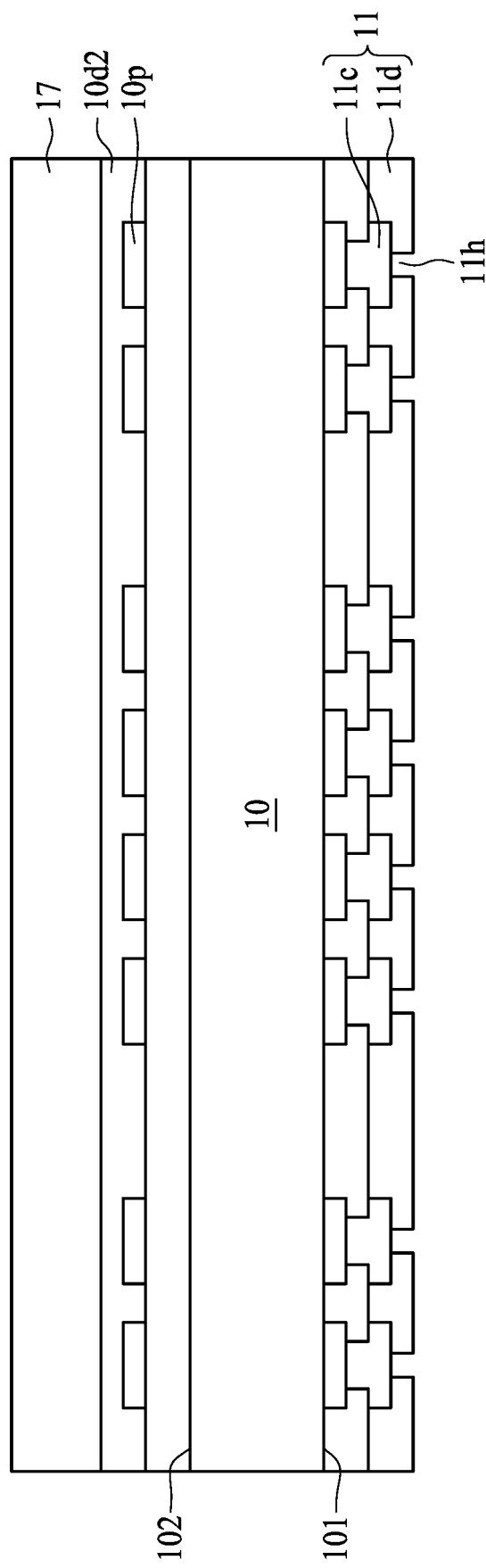

Referring to FIG. 5F, the carrier 59 and the adhesive layer 59h are removed from the dielectric layer 11d to expose the holes 11h and a surface of the dielectric layer 11d facing away from the carrier 10.

Figure 5G:
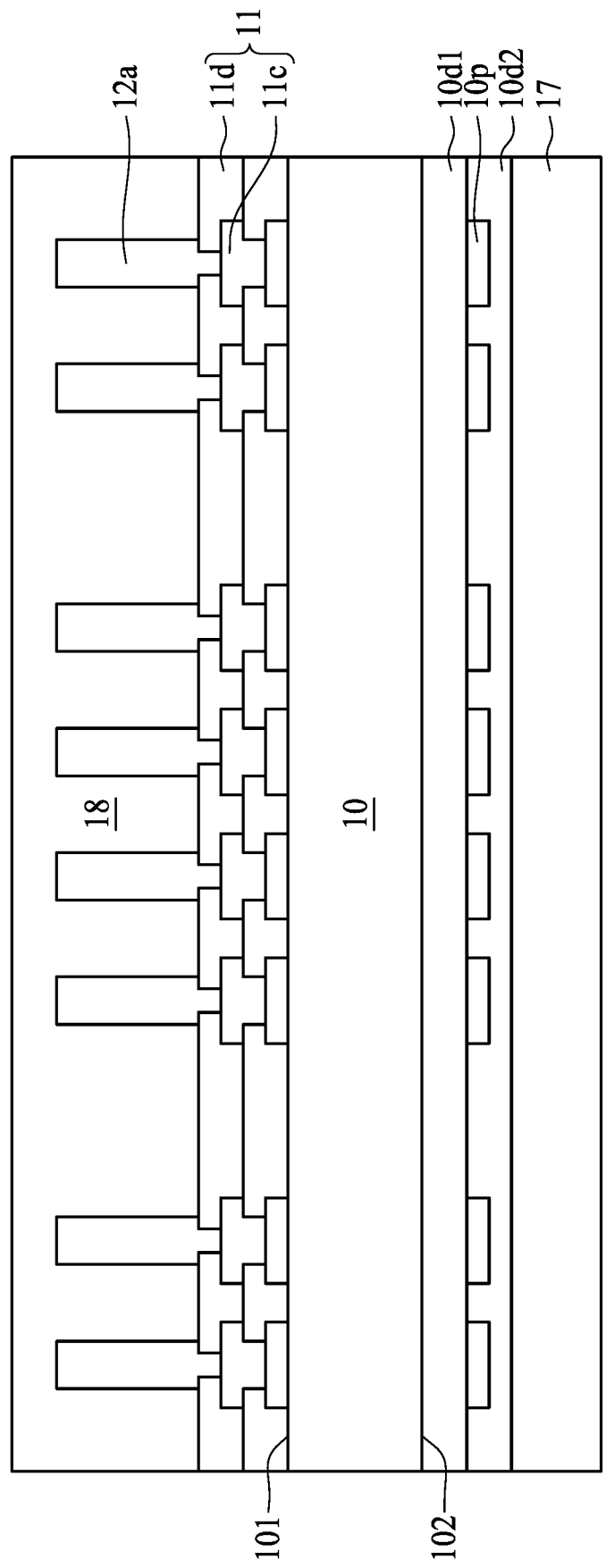

Referring to FIG. 5G, conductive structures 12a are formed on the circuit layer 11 to be electrically connected to the circuit layer 11. For example, the conductive structures 12a may extend within the holes 11h and connected to the conductive layer 11c. In some embodiments, the conductive structures 12a may be formed by, for example but is not limited to, plating technique.

A package body 18 is then formed on the dielectric layer 11d to fully cover the conductive structures 12a. In some embodiments, the package body 18 is formed by, for example, by a transfer molding technique, a compression technique or any other suitable techniques.

Figure 5H:
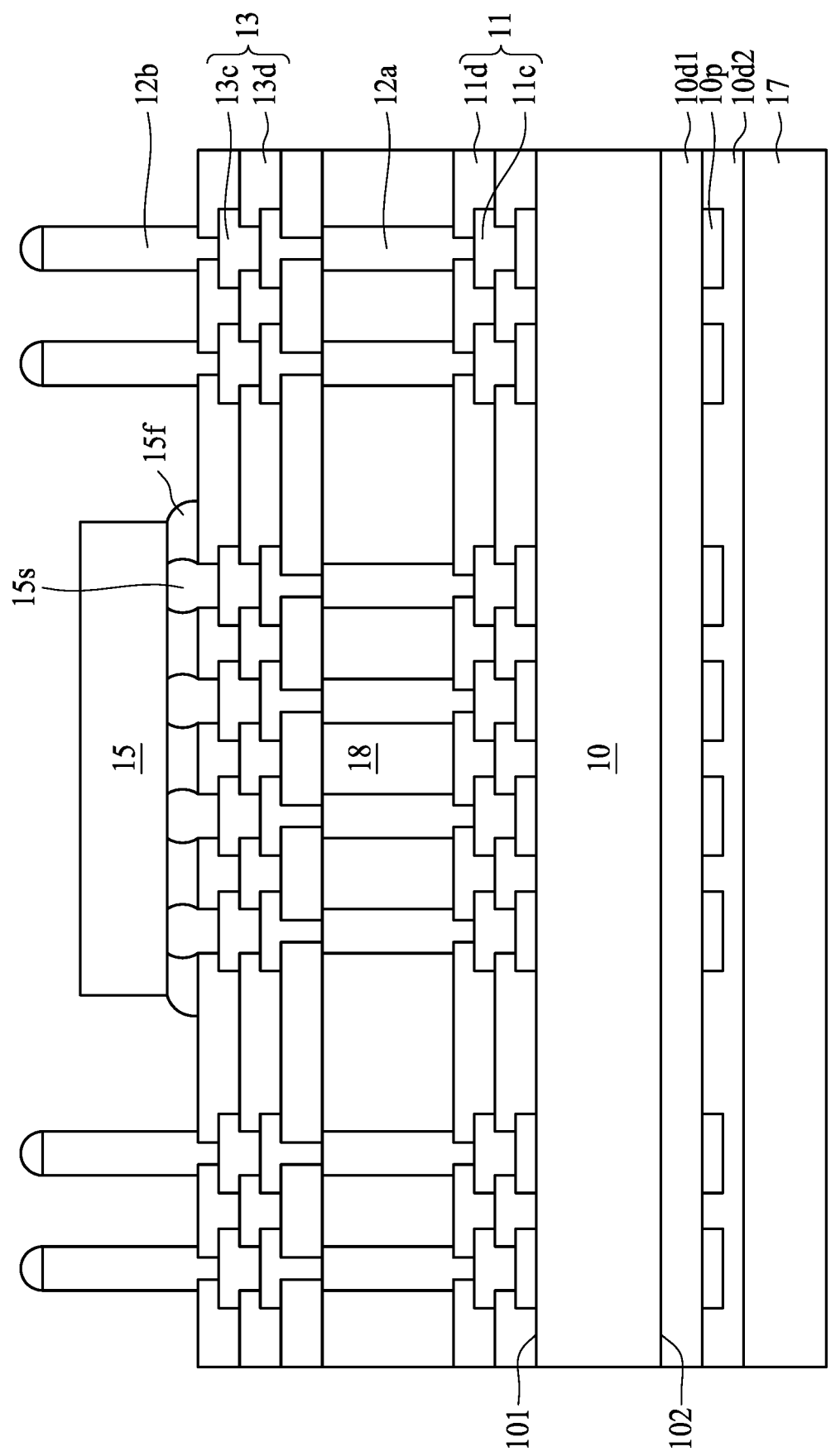

Referring to FIG. 5H, a portion of the package body 18 is removed to expose a portion (e.g., a top surface) of the conductive structures 12a. A circuit layer 13 including one or more conductive layers 13c and one or more dielectric layers 13d is formed on the package body 18 and electrically connected to the conductive structures 12a. For example, the conductive layer 13c of the circuit layer 13 is electrically connected to the top surface of the conductive structures 12a exposed from the package body 18.

Conductive structures 12b are formed on the circuit layer 13 and electrically connected to the circuit layer 13. An electronic component 15 is then disposed on the circuit layer 13 and electrically connected to the circuit layer 13 through electrical contacts 15s (e.g., solder balls). In some embodiments, the electronic component 15 may be connected to the circuit layer 13 through flip-chip or any other suitable processes. In some embodiments, an underfill 15f may be formed between the electronic component 15 and the circuit layer 13 to cover the electrical contacts 15s.

In some embodiments, singulation may be performed to separate out individual semiconductor package devices including the semiconductor package device 1B as shown in FIG. 1B. That is, the singulation is performed through the dielectric layers 10d1, 10d2, the circuit layers 11, 13 and the package bodies 17, 18. The singulation may be performed, for example, by using a dicing saw, laser or other appropriate cutting technique.

In some comparative embodiments, after the operation illustrated in FIG. 5A, conductive structures 12a may be directly formed on the circuit layer 11 without placing the carrier 59 on the circuit layer 11. The package body 18 is formed on the circuit layer 11 to cover the conductive structures 12a. Then the dielectric layers 10d1, 10d2, the conductive layers 10p and the package body 17 are formed on the surface 102 of the carrier 10. However, since the carrier 10 has a relatively thin thickness (e.g., 400 micrometers), the rigidity or the structural strength of carrier 10 is insufficient for handling the processes as mentioned above. Hence, a warpage issue will occur for the carrier 10 due to the CTE mismatch between the carrier 10, the dielectric layers 10d1, 10d2, 11d and the package bodies 17, 18. In some embodiments, the carrier 10 may have a warpage of about 4 millimeters, which would render the failure of the processes as mentioned above.

In accordance with the embodiments as shown in FIG. 5B, the carrier 59 is disposed on the circuit layer 11. The dielectric layers 10d1, 10d2, the conductive layer 10p and the package body 17 are formed on the surface 102 of the carrier 10 as shown in FIGS. 5C to 5E. Since the carrier 59 can be used to balance the stress applied to the structure during the processes and to enhance the structural strength, the warpage issue can be eliminated or mitigated, which would increase the yield of manufacturing the semiconductor device package.

FIG. 6A, FIG. 6B, FIG. 6C, FIG. 6D, FIG. 6E, FIG. 6F, FIG. 6G and FIG. 6H illustrate a semiconductor manufacturing method in accordance with some embodiments of the present disclosure. In some embodiments, the method in FIG. 6A, FIG. 6B, FIG. 6C, FIG. 6D, FIG. 6E, FIG. 6F, FIG. 6G and FIG. 6H can be used to manufacture the semiconductor device package 1A in FIG. 1A. The operations illustrated in FIG. 6A, FIG. 6B, FIG. 6C, FIG. 6D, FIG. 6E, FIG. 6F, FIG. 6G and FIG. 6H are similar to the operations as shown in FIG. 5A, FIG. 5B, FIG. 5C, FIG. 5D, FIG. 5E, FIG. 5F, FIG. 5G and FIG. 5H, and some of the differences therebetween are described below.

Figure 6A:
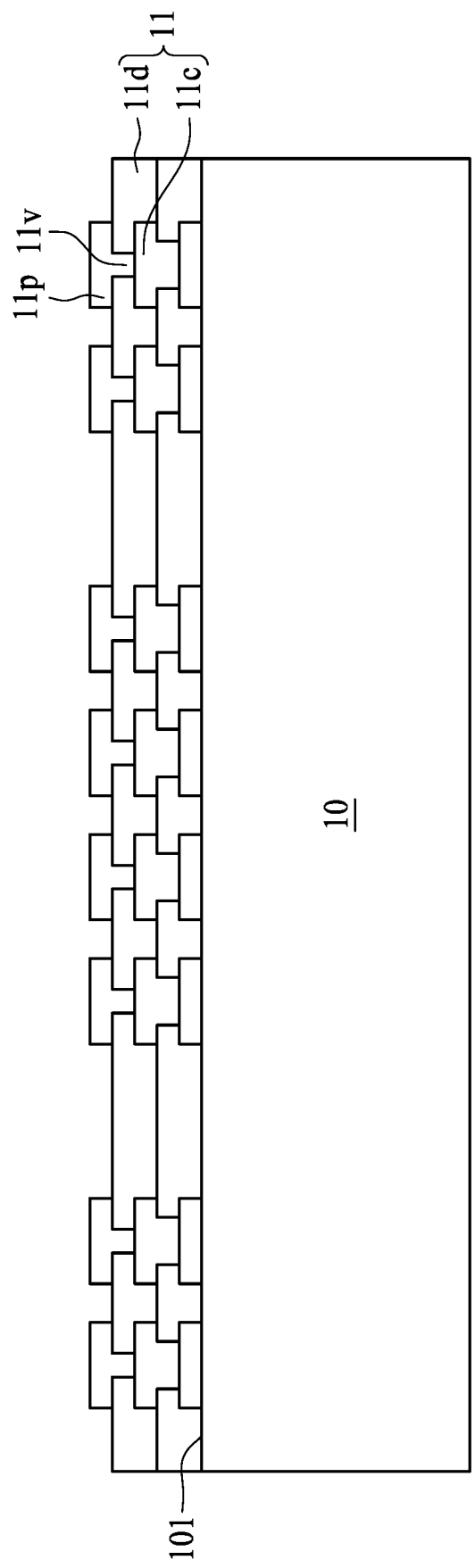
FIG. 6A, FIG. 6B, FIG. 6C, FIG. 6D, FIG. 6E, FIG. 6F, FIG. 6G and FIG. 6H illustrate a semiconductor manufacturing method in accordance with some embodiments of the present disclosure.

Referring to FIG. 6A, conductive pads 11p are formed on the circuit layer 11 and electrically connected to the conductive layer 11c of the circuit layer 11 through conductive vias 11v. For example, the conductive pad 11p may include a portion (e.g., the conductive via 11v) extending into the dielectric layer 11d and electrically connected to the conductive layer 11c. In some embodiments, the conductive via 11v is in contact with the conductive layer 11c. In other embodiments, a seed layer may be disposed between the conductive via 11v and the conductive layer 11c. The conductive pads 11p are disposed on the dielectric layer 11d of the circuit layer 11. For example, the conductive pads 11p are exposed from the dielectric layer 11d of the circuit layer 11.

Figure 6B:
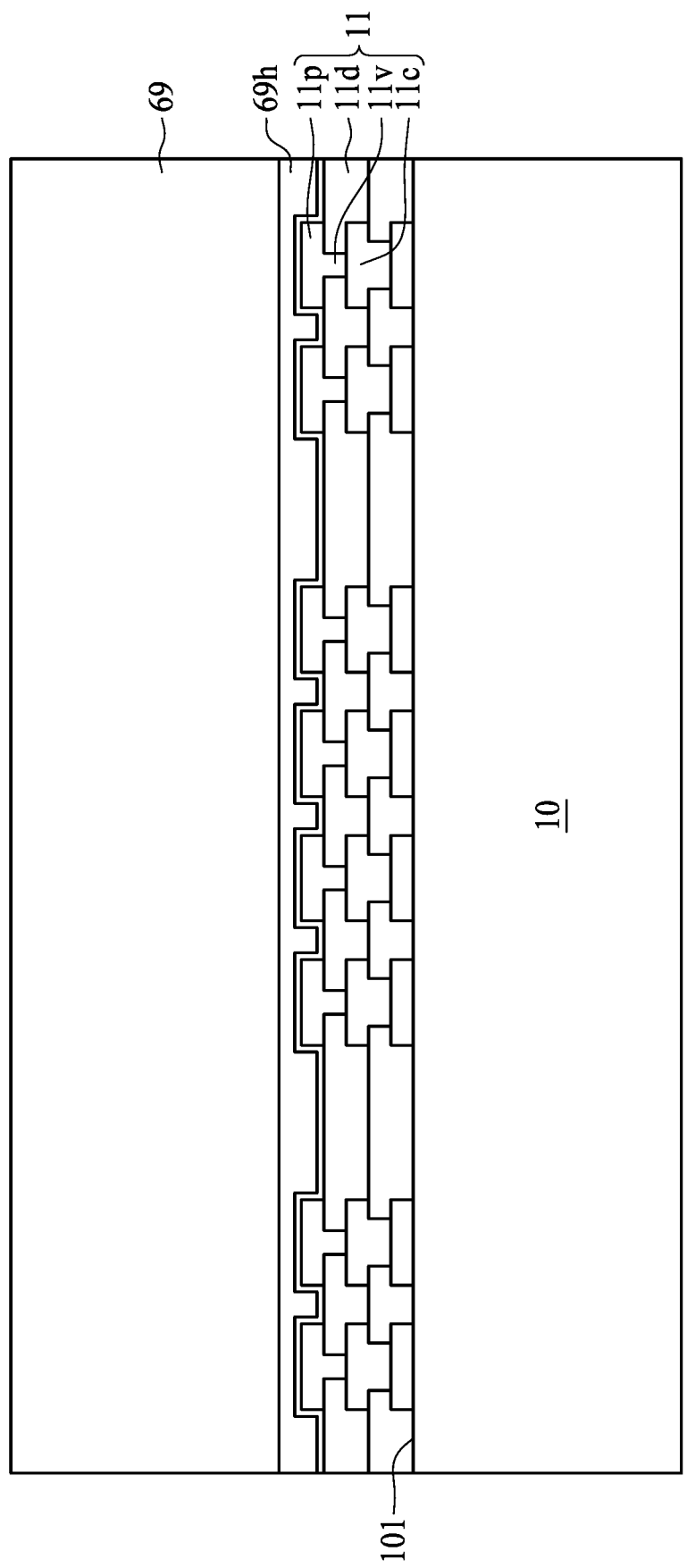
Figure 6C:
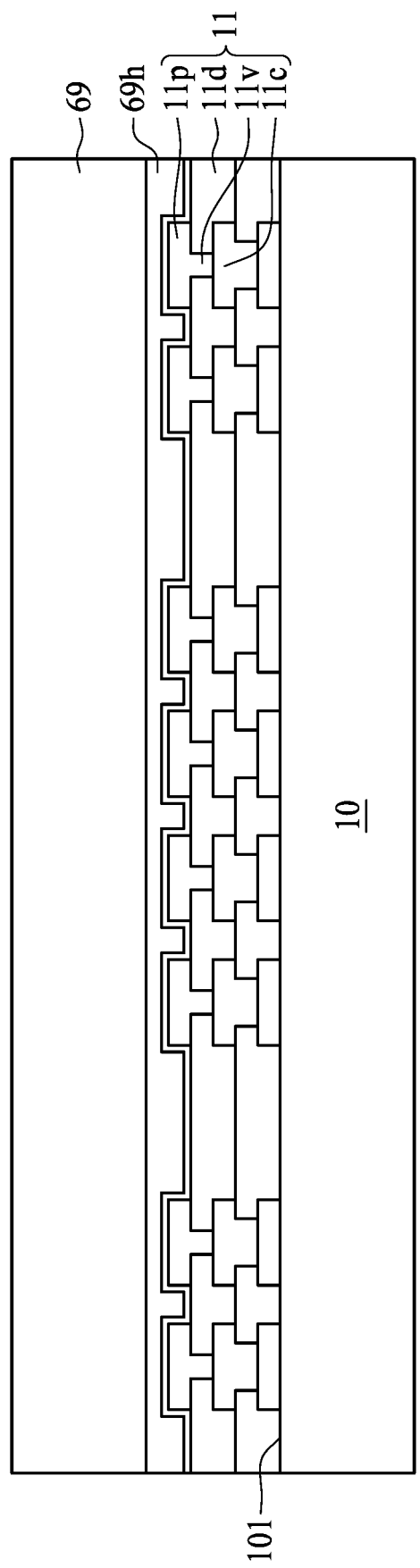
Figure 6D:
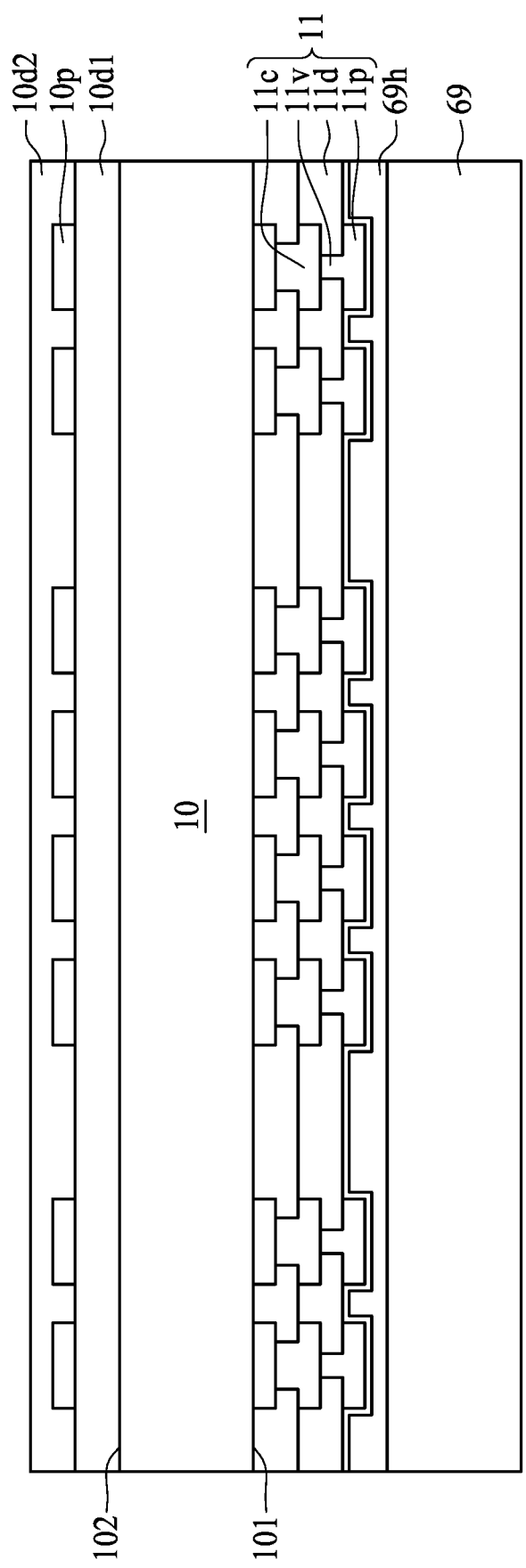
Figure 6E:
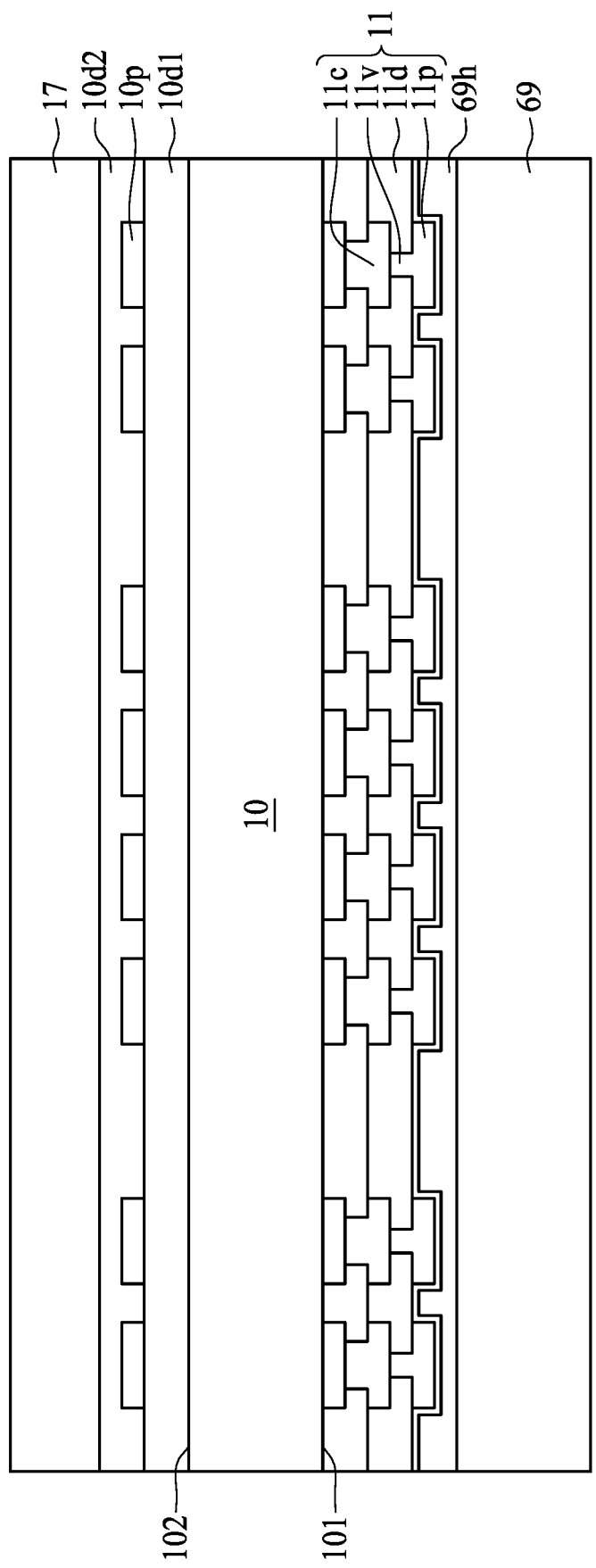
Figure 6F:
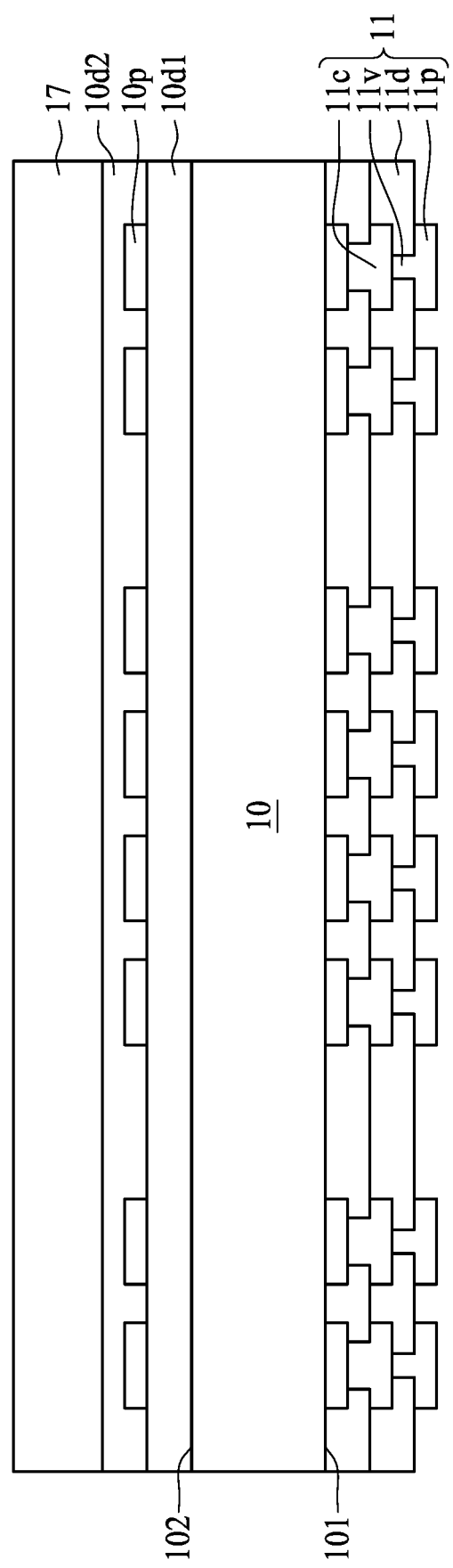
Figure 6G:
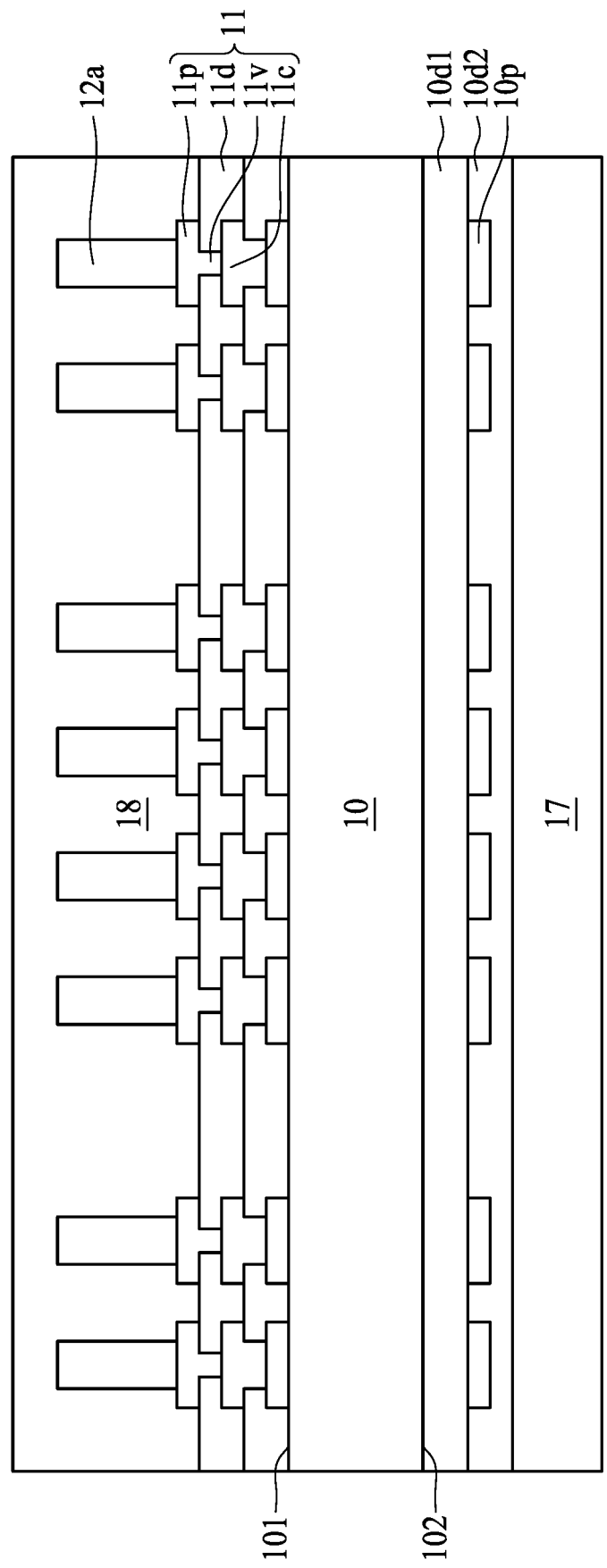
Figure 6H:
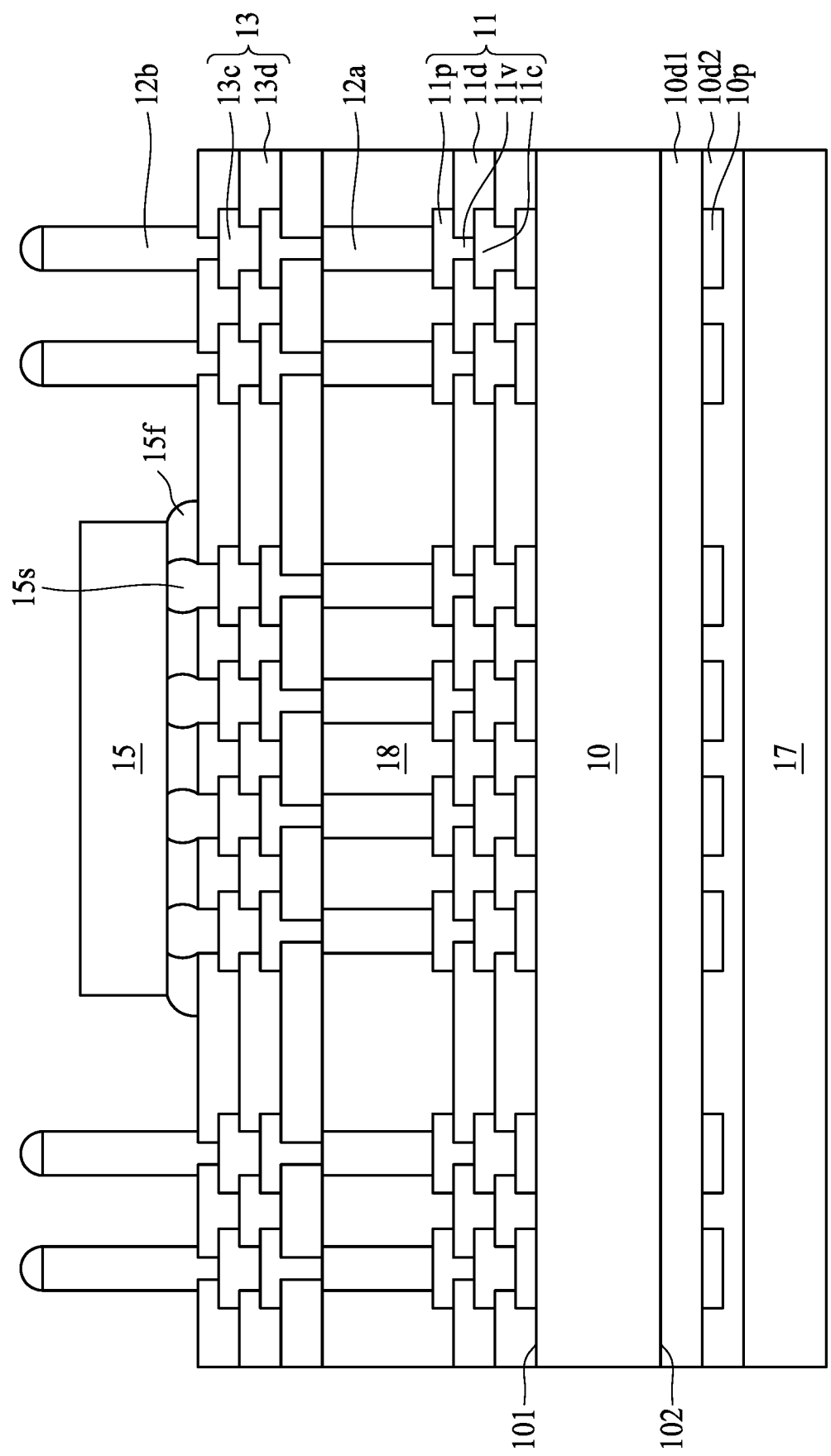

Referring to FIG. 6B, the adhesive layer 59h covers the conductive pads 11p. In some embodiments, a seed layer may be disposed between the adhesive layer 59h and the conductive pads 59h and the dielectric layer 11d. Referring to FIG. 6F, the carrier 59 is removed to expose the conductive pads 11p. Referring to FIG. 6G, the conductive structures 12a are formed on the conductive pads 11p, and the package body 18 is formed to cover the conductive structures 12a and a portion of the conductive pads 11p.

As shown in FIG. 5B, the adhesive layer 59h is extend within the holes 11h. The carrier 59 and the adhesive layer 59h are then removed from the dielectric layer 11d to expose the holes 11h as shown in FIG. 5F for the formation of the conductive structures 12a as shown in FIG. 5G. However, the adhesive layer 59 may not fully removed from the holes 11h, and parts of the adhesive layer 59h may remain in the holes 11h. Thus, the conductive structures 12a may not extend within the holes 11h to be electrically connected to the conductive layer 11c, which would cause an open circuit.

In accordance with the embodiments as shown in FIG. 6A, the conductive pads 11p are disposed on the corresponding holes 11h and electrically connected to the conductive layer 11c through the conductive vias 11v, and thus the adhesive layer 69h would not extend within the holes 11h in the operations shown in FIG. 6B. Therefore, the conductive structures 12a can be electrically connected to the conductive pads 11p, and the open circuit issue can be solved.

As used herein, the terms "substantially," "substantial," "approximately," and "about" are used to denote and account for small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a thickness of a film or a layer being "substantially uniform" can refer to a standard deviation of less than or equal to ±10% of an average thickness of the film or the layer, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 within 30 within 20 within 10 or within 1 μm of lying along the same plane. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
   a glass substrate having a first surface and a second surface opposite to the first surface;
   an emitting element disposed on the first surface of the glass substrate;
   a first molding compound disposed over the first surface of the glass substrate, wherein at least a part of the emitting element is disposed between the glass substrate and the first molding compound;
   a second molding compound disposed over the second surface of the glass substrate and separated from the first molding compound by the glass substrate; and
   a dielectric layer disposed between the glass substrate and the emitting element, wherein the first molding compound is in contact with the emitting element.

2. A semiconductor device package, comprising:
   a glass substrate having a first surface and a second surface opposite to the first surface;
   an emitting element disposed on the first surface of the glass substrate;
   a first molding compound disposed over the first surface of the glass substrate, wherein at least a part of the emitting element is disposed between the glass substrate and the first molding compound;
   a second molding compound disposed over the second surface of the glass substrate and separated from the first molding compound by the glass substrate;
   a plurality of conductive pillars over the second surface of the glass substrate and at least partially within the second molding compound; and
   an electronic component disposed over the second molding compound;
   wherein the plurality of conductive pillars have a first region overlapping with the electronic component and a second region non-overlapping with the electronic component from a cross-sectional view.

3. The semiconductor device package of claim 2, wherein the emitting element is at least partially overlapping with the first region and the second region of the plurality of conductive pillars from a cross-sectional view.

4. A semiconductor device package, comprising:
   a glass substrate having a first surface and a second surface opposite to the first surface;
   an emitting element disposed on the first surface of the glass substrate;
   a first molding compound disposed over the first surface of the glass substrate, wherein at least a part of the emitting element is disposed between the glass substrate and the first molding compound;
   a second molding compound disposed over the second surface of the glass substrate and separated from the first molding compound by the glass substrate; and
   a dielectric layer covering the emitting element, wherein the emitting element is in contact with the first surface of the glass substrate.

5. A semiconductor device package, comprising:
   a carrier having a first surface and a second surface opposite to the first surface;
   an emitting element disposed on the first surface of the carrier;
   a first package body disposed over the first surface of the carrier and spaced apart from the first surface of the carrier;
   a second package body disposed under the second surface of the carrier; and
   a conductive pillar extending in the second package body, wherein a height of the conductive pillar is less than a thickness of the second package body;
   a conductive pad disposed between the carrier and the conductive pillar, wherein a portion of the conductive pad is within the second package body;
   a dielectric layer disposed between the carrier and the conductive pad; and
   a conductive via in the dielectric layer,
   wherein a width of the conductive pad is greater than a width of the conductive via and a width of the conductive pillar, and the width of the conductive pillar is different from the width of the conductive via.

6. A semiconductor device package, comprising:
a carrier having a first surface and a second surface opposite to the first surface;
an emitting element disposed on the first surface of the carrier;
a first package body disposed over the first surface of the carrier and spaced apart from the first surface of the carrier;
a second package body disposed under the second surface of the carrier;
a conductive pillar extending in the second package body, wherein a height of the conductive pillar is less than a thickness of the second package body; and
a first conductive layer in contact with the second surface of the carrier and disposed between the conductive pillar and the carrier;
wherein the conductive pillar is spaced apart from the first conductive layer through a second conductive layer on the first conductive layer and a dielectric layer covering the second conductive layer.

7. The semiconductor device package of claim 6, wherein the conductive pillar, the first conductive layer and the second conductive layer are overlapping in a direction substantially perpendicular to the second surface of the carrier.

8. The semiconductor device package of claim 4, wherein the first molding compound and the second molding compound each includes an epoxy resin and fillers.

9. The semiconductor device package of claim 4, further comprising:
a conductive layer on the second surface of the glass substrate and separated from the emitting element by the glass substrate, wherein the conductive layer includes antenna patterns.

10. The semiconductor device package of claim 4, further comprising:
a conductive structure covered by the second molding compound and defining an antenna structure.

11. The semiconductor device package of claim 4, further comprising:
a conductive structure covered by the second molding compound; and
a conductive pad partially within the conductive structure.

12. The semiconductor device package of claim 11, wherein a width of the conductive pad is less than a width of the conductive structure.

13. The semiconductor device package of claim 5, wherein a lateral surface of the conductive pad is in contact with the second package body.

* * * * *